United States Patent
Zhang et al.

(10) Patent No.: US 11,711,075 B2
(45) Date of Patent: Jul. 25, 2023

(54) LOW-POWER CONSUMPTION NEGATIVE VOLTAGE GENERATOR FOR RADIO FREQUENCY SWITCHES

(71) Applicant: GUANGDONG UNIVERSITY OF TECHNOLOGY, Guangzhou (CN)

(72) Inventors: Zhihao Zhang, Guangzhou (CN); Jiehai Zhou, Guangzhou (CN); Caifeng Mai, Guangzhou (CN); Chaoyu Huang, Guangzhou (CN); Bin Liu, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/955,332

(22) Filed: Sep. 28, 2022

(65) Prior Publication Data
US 2023/0022420 A1    Jan. 26, 2023

Related U.S. Application Data

(63) Continuation of application No. PCT/CN2022/094823, filed on May 25, 2022.

(30) Foreign Application Priority Data

May 27, 2021  (CN) .......................... 202110583794.9

(51) Int. Cl.
H03K 17/04 (2006.01)
H03K 19/21 (2006.01)

(52) U.S. Cl.
CPC ............. *H03K 17/04* (2013.01); *H03K 19/21* (2013.01)

(58) Field of Classification Search
CPC .... H03K 3/027; H03K 3/033; H03K 5/15053; H03K 5/15086; H03K 5/151;
(Continued)

(56) References Cited

U.S. PATENT DOCUMENTS

| | | | |
|---|---|---|---|
| 6,313,707 B1 | 11/2001 | Fischer et al. | |
| 7,432,752 B1 | 10/2008 | Lee et al. | |
| 10,270,349 B2* | 4/2019 | Chen | ..................... H02M 7/103 |

FOREIGN PATENT DOCUMENTS

| | | |
|---|---|---|
| CN | 1542580 A | 11/2004 |
| CN | 103873050 A | 6/2014 |

(Continued)

OTHER PUBLICATIONS

First Office Action issued in counterpart Chinese Patent Application No. 202110583794.9, dated Jan. 13, 2022.

*Primary Examiner* — Long Nguyen
(74) *Attorney, Agent, or Firm* — Westbridge IP LLC

(57) ABSTRACT

Disclosed is a low-power negative voltage generator for RF switches, which is provided with a monostable trigger and a voltage-controlled oscillator before a non-overlapping clock circuit and a charge pump. The monostable trigger can change from a stable state to a transient state when a switch channel selection signal jumps; the clock frequency of the voltage controlled oscillator will be increased during the transient state of the monostable trigger, and after the monostable trigger returns to a stable state, its clock frequency will be reduced to the initial state, thereby ensuring that the circuit power consumption is reduced while the transient characteristic is high.

2 Claims, 4 Drawing Sheets

(58) Field of Classification Search
CPC ........ H03K 5/1515; H03K 17/04; H03L 7/08;
H03L 7/0891; H03L 7/099
See application file for complete search history.

(56) References Cited

FOREIGN PATENT DOCUMENTS

| | | |
|---|---|---|
| CN | 203747776 U | 7/2014 |
| CN | 104656728 A | 5/2015 |
| CN | 105159372 A | 12/2015 |
| CN | 105703769 A | 6/2016 |
| CN | 106656126 A | 5/2017 |
| CN | 206421259 U | 8/2017 |
| CN | 107395179 A | 11/2017 |
| CN | 107528582 A | 12/2017 |
| CN | 110048701 A | 7/2019 |
| CN | 110113039 A | 8/2019 |
| CN | 112416043 A | 2/2021 |
| CN | 113110677 A | 7/2021 |
| ES | 2309647 | 12/2008 |
| WO | 2010114183 A1 | 10/2010 |

\* cited by examiner

LOW-POWER CONSUMPTION NEGATIVE VOLTAGE GENERATOR FOR RADIO FREQUENCY SWITCHES

CROSS-REFERENCE TO RELATED APPLICATIONS

This application is a continuation of International Application No. PCT/CN2022/094823, filed on May 25, 2022, which claims priority to Chinese Patent Application No. 202110583794.9, filed on May 27, 2021. The disclosures of the above-mentioned applications are incorporated herein by reference in their entireties.

TECHNICAL FIELD

The application relates to the technical field of radio frequency (RF) switches, and in particular to a low-power consumption negative voltage generator for RF switches.

BACKGROUND

With the rapid development of communication technology, the 5G era with low delay, high reliability, low power consumption and internet of everything has come. As one part of the RF front end, RF switch plays an increasingly important role. The types and configurations of RF switches are more and more diverse, and the requirements for the performance of RF switches are higher and higher. An RF switch controller with good performance can provide stable bias to the RF switch while maintaining low power consumption, improve the isolation and linearity of the RF switch, and speed up the starting and switching of the switch.

Existing RF switches often adopt a constant negative voltage generator structure, which can provide negative voltage bias to the gate and body of the switch transistor, thus effectively reducing the equivalent capacitance (Coff) when the RF switch is turned off, and greatly improving the linearity and isolation of the RF switch. FIG. 1 is a structural schematic diagram of a traditional constant negative voltage generator in the prior art which mainly consists of an oscillator, a non-overlapping clock circuit and a charge pump; the oscillator with a specific clock frequency provides negative voltage bias, and the high-frequency clock can speed up the establishment of the output of the charge pump, thus speeding up the switching of the RF switch, but the high-frequency clock often needs to consume large current.

It can be seen from the above that the traditional negative voltage generator cannot provide a high frequency clock while having low power consumption.

SUMMARY

The objective of the present application is to solve at least one of the above-mentioned technical defects, especially the technical defect that the negative voltage generator in the prior art cannot provide a high-frequency clock while having low power consumption.

The application provides a low-power consumption negative voltage generator for RF switches, including:

a monostable trigger, a voltage controlled oscillator, a non-overlapping clock circuit and a charge pump;

the monostable trigger receives a switch channel selection signal and changes from a steady state to a transient state when the switch channel selection signal jumps;

the voltage controlled oscillator receives a steady state and a transient state output by the monostable trigger, increases a clock frequency when the steady state of the monostable trigger changes to the transient state, and restores the clock frequency to an initial state after the transient state of the monostable trigger recovers to the steady state;

the non-overlapping clock circuit receives a latest clock frequency output by the voltage controlled oscillator, and uses the latest clock frequency to control a negative voltage bias output by the charge pump.

Optionally, when the state of the monostable trigger is the transient state, a maintaining time of the transient state is determined according to the output stabilization time of the charge pump.

Optionally, the monostable trigger is one of a constant 1 integral double-edge monostable trigger, a constant 0 integral monostable trigger and a differential monostable trigger.

Optionally, when the monostable trigger is the constant 1 integral double-edge monostable trigger, the constant 1 integral double-edge monostable trigger includes an integral Resistor-Capacitance (RC) circuit and an exclusive NOR gate.

Optionally, the voltage controlled oscillator is a single-ended voltage controlled oscillator.

Optionally, the single-ended voltage controlled oscillator includes a current steering switch and a ring oscillator;

when the current steering switch is turned on, a current supplied to the ring oscillator increases;

when the current steering switch is turned off, a current supplied to the ring oscillator decreases.

Optionally, the turning on and turning off of the current steering switch is related to a steady state and a transient state output by the monostable trigger.

Optionally, when the monostable trigger is the constant 1 integral double-edged monostable trigger, the output of the constant 1 double-edged monostable trigger is 1, and the current steering switch is turned off; when the output of the constant 1 double-edged monostable trigger is 0, the current steering switch is turned on.

It can be seen from the above technical scheme that the embodiment of the application has the following advantages.

The application provides a low-power consumption negative voltage generator for RF switches, which is provided with a monostable trigger and a voltage controlled oscillator before a non-overlapping clock circuit and a charge pump. The monostable trigger can change from a steady state to a transient state when a switch channel selection signal jumps; the clock frequency of the voltage controlled oscillator will be increased during the transient state of the monostable trigger, and after the monostable trigger returns to a steady state, the it-s-clock frequency will be reduced to an initial state, thereby ensuring that the circuit power consumption is reduced while the transient characteristic is high.

BRIEF DESCRIPTION OF THE DRAWINGS

In order to more clearly explain the embodiments of the present application or the technical solutions in the prior art, the following will briefly introduce the drawings that need to be used in the description of the embodiments or the prior art. Obviously, the drawings in the following description are only some embodiments of the present application. For those of ordinary skill in the art, other drawings can be obtained according to these drawings without any creative labour.

DETAILED DESCRIPTION OF THE EMBODIMENTS

The technical solutions in the embodiments of the present application will be clearly and completely described below with reference to the drawings in the embodiments of the present application. Obviously, the described embodiments are only part of the embodiments of the present application, but not all of them. Based on the embodiment of the present application, all other embodiments obtained by ordinary technicians in the field without creative labour are within the scope of the present application.

Those skilled in the art can understand that the singular forms "a", "an", and "the" used here can also be plural forms unless specifically stated. It should be further understood that the word "including" used in the specification of this application refers to the presence of the features, integers, steps, operations, elements and/or components, but does not exclude the presence or addition of one or more other features, integers, steps, operations, elements, components and/or their combinations.

It can be understood by those skilled in the art that, unless otherwise defined, all terms (including technical terms and scientific terms) used here have the same meanings as those commonly understood by those skilled in the art to which this application belongs. It should also be understood that terms such as those defined in general dictionaries should be understood to have meanings consistent with those in the context of the prior art, and will not be interpreted with idealized or overly formal meanings unless specifically defined as in the embodiment of this application.

With the rapid development of communication technology, the 5G era with low delay, high reliability, low power consumption and internet of everything has come. As one part of the RF front end, the RF switch plays an increasingly important role. The types and configurations of RF switches are more and more diverse, and the requirements for the performance of RF switches are higher and higher. An RF switch controller with good performance can provide stable bias to the RF switch while maintaining low power consumption, improve the isolation and linearity of the RF switch, and speed up the starting and switching of the RF switch.

Figure 1:
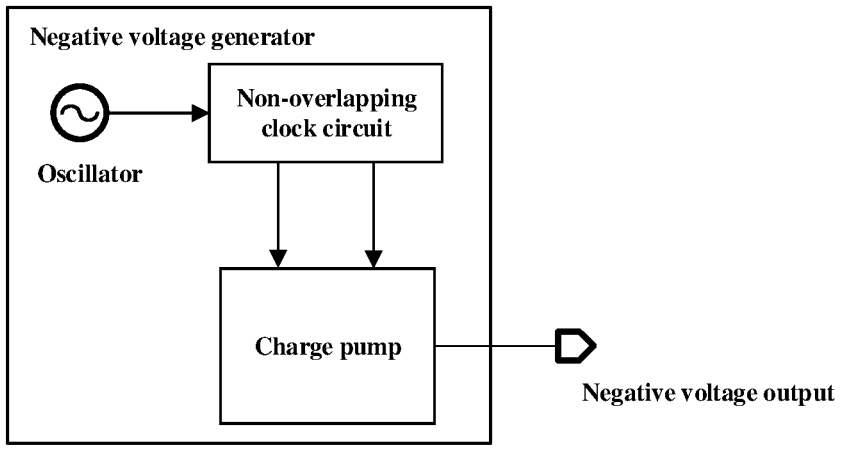
FIG. 1 is a structural schematic diagram of a traditional negative voltage generator in the prior art.

Existing RF switches often adopt a constant negative voltage generator structure, which can provide negative voltage bias to the gate and body of the switch transistor, thus effectively reducing an equivalent off-state capacitance (Coff) when the RF switch is turned off, and greatly improving the linearity and isolation of the RF switch. FIG. 1 is a conventional negative voltage generator in the prior art which mainly consists of an oscillator, a non-overlapping clock circuit and a charge pump; the oscillator with a specific clock frequency provides negative voltage bias, and the oscillator with a high-frequency clock may speed up the establishment of the output of the charge pump, thus speeding up the switching of the RF switch, but the high-frequency clock often needs to consume a large current.

Therefore, the objective of the present application is to solve the technical problem that the negative voltage generator in the prior art cannot provide a high-frequency clock while having low power consumption, and to propose the following technical scheme.

Figure 2:
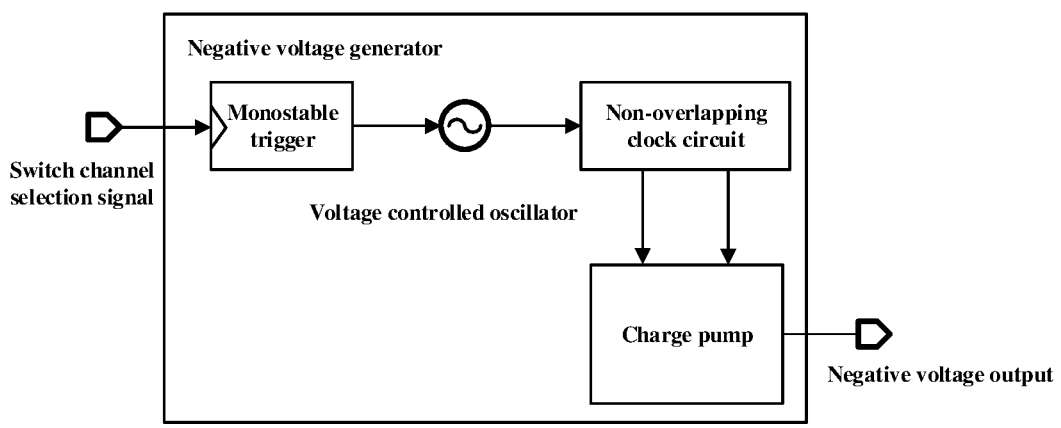
FIG. 2 is a structural schematic diagram of a low-power consumption negative voltage generator for RF switches provided by the embodiment of the present application.

In one embodiment, FIG. 2 is a structural schematic diagram of a low-power consumption negative voltage generator for RF switches provided by the embodiment of the present application. The present application provides a low-power consumption negative voltage generator for RF switches, which specifically includes a monostable trigger, a voltage controlled oscillator, a non-overlapping clock circuit and a charge pump.

The monostable trigger receives a switch channel selection signal and changes from a steady state to a transient state when the switch channel selection signal jumps;

The voltage controlled oscillator receives a steady state or a transient state output by the monostable trigger, increases a clock frequency when the steady state of the monostable trigger changes to the transient state, and restores the clock frequency to an initial state after the transient state of the monostable trigger recovers to the steady state;

The non-overlapping clock circuit receives a latest clock frequency output by the voltage controlled oscillator, and uses the latest clock frequency to control a negative voltage bias output by the charge pump.

In this application, the negative voltage generator includes a monostable trigger, a voltage controlled oscillator, a non-overlapping clock circuit and a charge pump. As shown in FIG. 2, the output terminal of the monostable trigger is connected with the input terminal of the voltage controlled oscillator, the output terminal of the voltage controlled oscillator is connected with the input terminal of the non-overlapping clock circuit, the output terminal of the non-overlapping clock circuit is connected with the input terminal of the charge pump, and the charge pump finally generates negative voltage.

Specifically, when the negative voltage generator is working, the switch channel selection signal is received by the monostable trigger, which is a monostable circuit triggered by both edges. The operation characteristics of the monostable circuit triggered by both edges are as follows: the output has only one steady state, and when triggered by the up and down jump signals, it may change from the steady state to the transient state, but after the transient state is maintained for a period of time, it may automatically return to the steady state.

It can be understood that the steady state time in this application depends on the parameters of the circuit itself, rather than the width of the trigger pulse signal; when it is detected that the switch channel selection signal of the RF switch changes, such as from low to high or from high to low, the monostable trigger will change from the steady state to the transient state, and automatically return to the steady state after the transient state is maintained for a period of time.

Further, the voltage controlled oscillator in this application refers to an oscillator with controllable frequency. When the frequency of the selected oscillator is controllable, the output clock frequency can be controlled by a monostable circuit triggered by double edges.

For example, when the switch channel selection signal is switched, a signal jump will be generated, which may trigger the monostable trigger to change from a steady state to a transient state and maintain it for a period of time. During the transient state of the monostable trigger, the clock frequency of the voltage controlled oscillator will be increased, and when the transient state of the mono stable trigger returns to the steady state, the clock frequency of the voltage controlled oscillator will return to an initial state.

Further, the non-overlapping clock circuit in the application is connected with the voltage controlled oscillator, receives the latest clock frequency output by the voltage controlled oscillator, and controls the charge pump to work by using the latest clock frequency, so that the charge pump output negative voltage bias for the RF switch, thereby improving the linearity and isolation of the RF switch.

When the switch channel selection signal switches and generates signal jump, the monostable trigger may be triggered to change from a steady state to a transient state and maintain for a period of time. During the transient state of the monostable trigger, the clock frequency of the voltage controlled oscillator will be increased, and at this time, the clock frequency transmitted to the charge pump through the non-overlapping clock circuit will also be increased, and the high-frequency clock may speed up the establishment of the charge pump output to speed up the switching. When the monostable trigger is restored from the transient state to the steady state, the clock frequency output by the voltage controlled oscillator will be restored to an initial state. At this time, the charge pump has established a stable output, and reducing the clock frequency will not affect the working state, thus ensuring that the circuit power consumption is reduced while the transient characteristics are high.

It can be understood that the transient time of the monostable trigger in this application depends on the parameters of the circuit itself, such as the values of R and C in the integral RC circuit. By designing the circuit parameters of the monostable trigger, the transient state time of the monostable trigger can be just equal to the shortest time required to establish the output stability of the charge pump. When the output of the charge pump is established, the monostable trigger returns from the transient state to the steady state, and at this time, the charge pump keeps stable output. Therefore, the power consumption can be reduced while ensuring high transient characteristics of the negative voltage generator.

Figure 3:
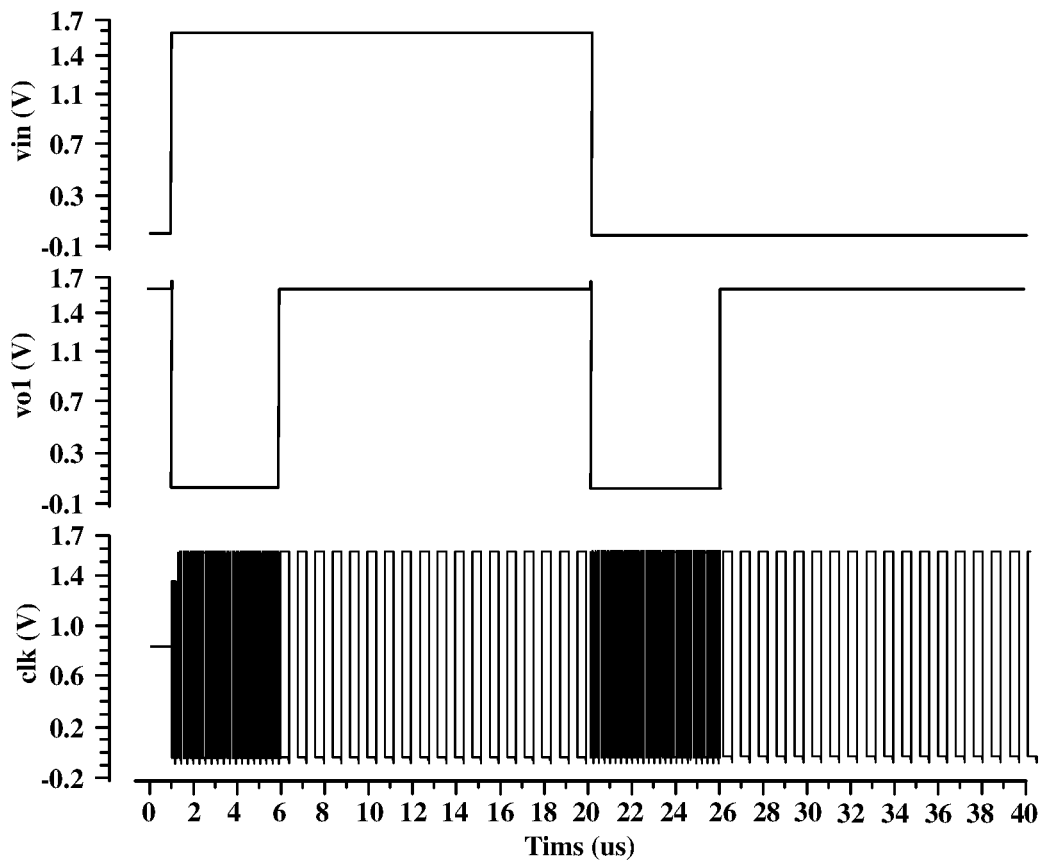
FIG. 3 is a schematic diagram of the experimental results of an experiment with a negative voltage generator provided by the embodiment of the present application.

Schematically, FIG. 3 is a schematic diagram of the experimental results when the negative voltage generator is used for the experiment provided by the embodiment of the present application; in FIG. 3, when the switching signal of the switching channel selection signal is detected, the monostable trigger changes from a steady state to a transient state. During the transient state of the monostable trigger, the clock frequency of the voltage controlled oscillator increases and maintains for a period of time, and then decreases after the monostable trigger recovers from the transient state to the steady state. Thus, the clock frequency can be increased when the switching channel selection signal is switched, and the clock frequency can be reduced after the output of the charge pump is stably established, thus ensuring high transient characteristics and reducing circuit power consumption.

The above embodiment specifically illustrates the working process of a low-power consumption negative voltage generator for RF switches in this application, and the maintaining time of the transient state of the monostable trigger in this application will be described in detail below.

In one embodiment, when the state of the monostable trigger is a transient state, the maintaining time of the transient state is determined according to the output stabilization time of the charge pump.

In this embodiment, in order to reduce power consumption, the application only increases the clock frequency of the voltage controlled oscillator when the switch channel selection signal is switched and maintains for a period of time, which can be determined by the transient state maintaining time, and the transient state maintaining time can be determined according to the output stabilization time of the charge pump.

For example, a high-frequency clock can speed up the establishment of stable output of the charge pump, thus speeding up the switching of an RF switch, but the high-frequency clock often needs to consume a large current. Therefore, in this application, the maintaining time of the transient state can be set as the shortest time required to establish the output stability of the charge pump, and the clock frequency may be reduced after the output stability of the charge pump is established, so as to reduce the power consumption.

It can be understood that in this application, when determining the shortest time required to establish the output stability of the charge pump, the calculation may be made according to the model and parameters of the selected charge pump, and the details are not limited here.

The above-mentioned embodiments explain the maintaining time of the transient state of the monostable trigger in detail in this application, and the selection of the monostable trigger in this application will be explained below.

In one embodiment, the monostable trigger may be one of a constant 1 integral double-edge monostable trigger, a constant 0 integral monostable trigger and a differential monostable trigger.

The above embodiments explain the selection of monostable triggers in this application, and the composition of the constant 1 integral double-edge monostable trigger will be described in detail below.

Figure 4:
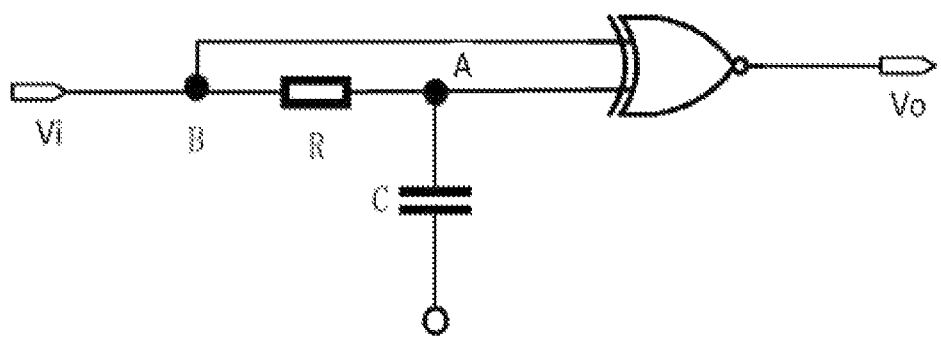
FIG. 4 is a structural schematic diagram of a constant 1 integral double-edge monostable trigger provided by the embodiment of the present application.

In one embodiment, FIG. 4 is a structural schematic diagram of a constant 1 integral double-edge monostable trigger provided by the embodiment of the present application; when the monostable trigger can be a constant 1 integral double-edge monostable trigger, the constant 1 integral double-edge monostable trigger includes an integral RC circuit and an exclusive NOR gate.

In this embodiment, the basic structure of the constant 1 integral double-edge monostable trigger is shown in FIG. 4. The circuit includes an integral RC circuit and an exclusive NOR gate, and the working process is as follows: the initial state of $V_i$ can be 0 or 1, and the point B is 1. When $V_i$ jumps from 0 to 1, the voltage $V_A$ at point A may not suddenly change, and $V_A$ is still lower than $V_{TH}$. The output signal $V_O$ of the exclusive NOR gate jumps to 0, and when $V_A$ slowly charges to $V_{TH}$ under the action of RC, $V_O$ returns to the original steady state value of 1; when V jumps from 1 to 0, $V_A$ is still higher than $V_{TH}$, and the output signal $V_O$ of the exclusive NOR gate jumps to 0. After RC discharges slowly, $V_A$ drops to $V_{TH}$, $V_O$ returns to the steady state value of 1.

When the input $V_i$ changes from 0 to 1, the pulse width output by the circuit is $$T_{W1} = RC \ln \frac{V_{cc}}{V_{cc} - V_{TH}},$$

and when the input $V_i$ changes from 1 to 0, the pulse width output by the circuit is $$T_{W2} = RC \ln \frac{V_{cc}}{V_{TH}}.$$

Further, the output truth table of the constant 1 integral double-edge mono stable trigger is shown in Table 1:

TABLE 1

Truth Table of Integral Double-edge Monostable Trigger

| $V_i$ | A | $V_o$ |
|---|---|---|
| 0 | 0 | 1 |
| 1 | 0 | 0 |
| 1 | 1 | 1 |
| 0 | 1 | 0 |

Figure 5:
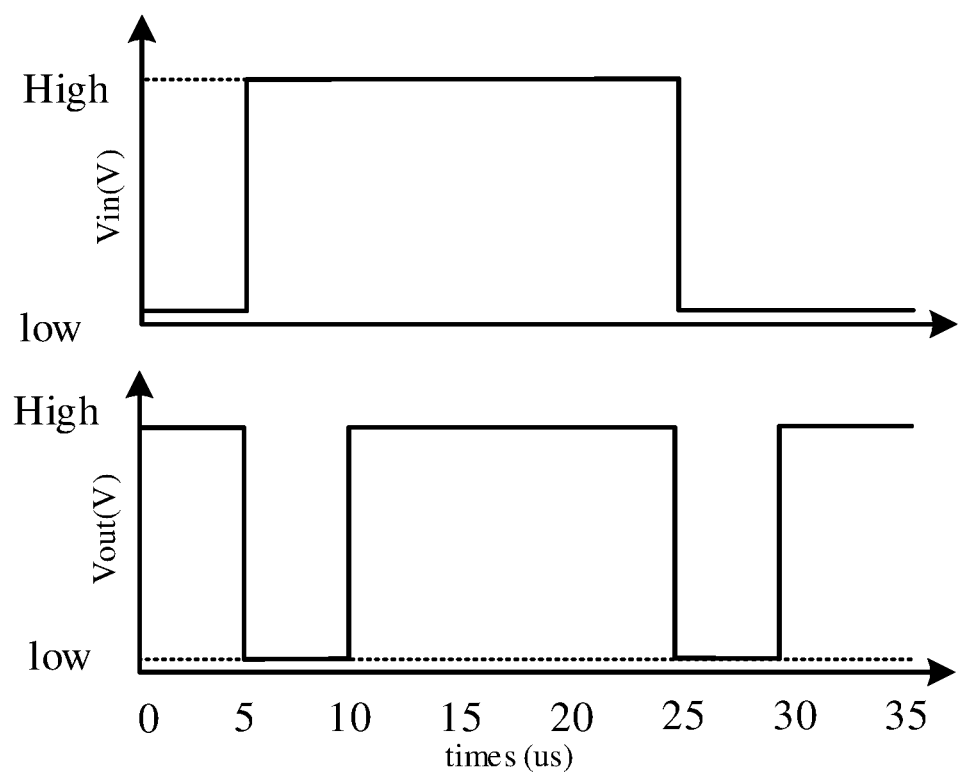
FIG. 5 is a schematic diagram of circuit diagram simulation results of a constant 1 integral double-edge monostable trigger provided by the embodiment of the present application.

Furthermore, the circuit diagram simulation results of the constant 1 integral double-edge monostable trigger are shown in FIG. 5, which is a schematic diagram of the circuit diagram simulation results of the constant 1 integral double-edge monostable trigger provided by the embodiment of the present application. It can be seen from FIG. 5 that when the constant 1 integral double-edge monostable trigger is used in this application, its output state can change from a steady state to a transient state with the change of an input state, and then it will be restored from the transient state to the steady state.

In the above embodiment, the composition of the constant 1 integral double-edge monostable trigger is explained in detail, and the voltage controlled oscillator will be described below.

Figure 6:
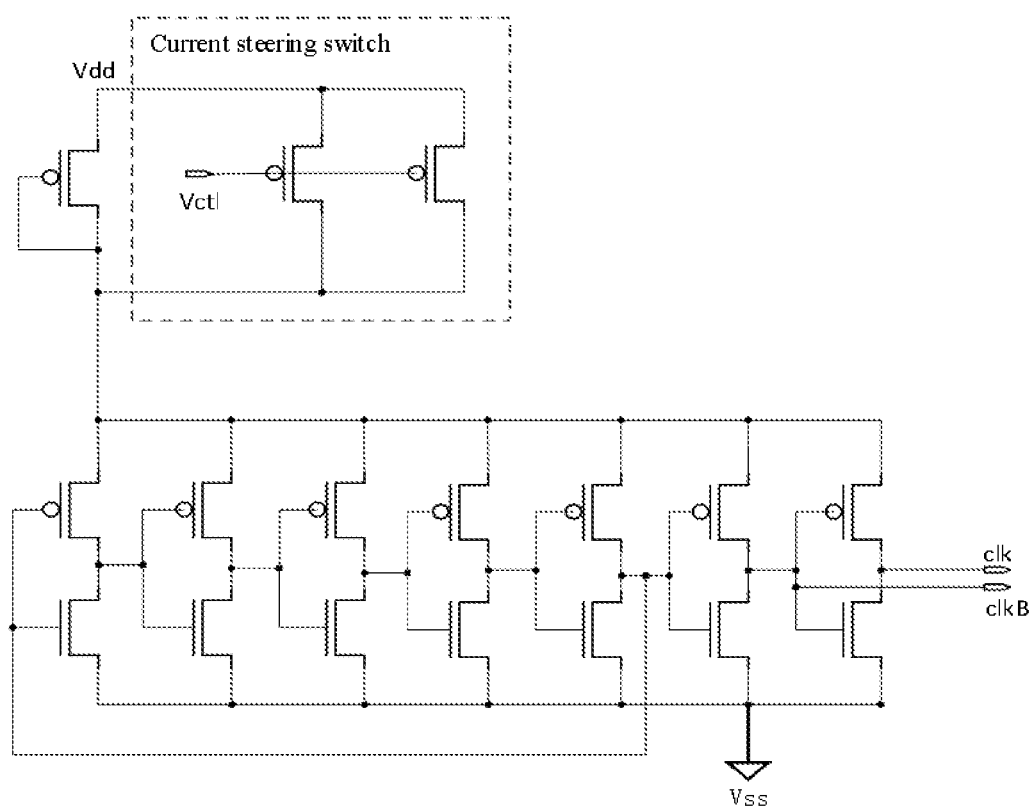
FIG. 6 is a schematic structural diagram of a single-ended voltage controlled oscillator provided by the embodiment of the present application.

In one embodiment, FIG. 6 is a schematic structural diagram of a single-ended voltage controlled oscillator provided by an embodiment of the present application; the voltage controlled oscillator can be a single-ended voltage controlled oscillator.

In one embodiment, the single-ended voltage controlled oscillator consists of a current steering switch and a ring oscillator; wherein when the current steering switch is turned on, the current supplied to a ring oscillator increases; when the current steering switch is turned off, a current supplied to the ring oscillator decreases.

In this embodiment, the voltage controlled oscillator can be a current hungry single-ended voltage controlled oscillator, and the structure diagram is shown in FIG. 6. By controlling the bias current steering switch by the control terminal ibias, a current supplied to the ring oscillator can be adjusted. For example, when the current steering switch is turned on, a current supplied to the ring oscillator increases and the clock frequency increases; when the current steering switch is turned off, a current supplied to the ring oscillator decreases and the clock frequency decreases.

The above embodiment describes the voltage controlled oscillator, and the working process of the single-ended voltage controlled oscillator will be described in detail below.

In one embodiment, the turning on and turning off of the current steering switch is related to a steady state or a transient state output by the monostable trigger.

In one embodiment, when the monostable trigger is a constant 1 integral double-edged monostable trigger, the output of the constant 1 double-edged monostable trigger is 1, and when the current steering switch is turned off, the output of the constant 1 double-edged monostable trigger is 0, and the current steering switch is turned on.

In this embodiment, the turning on and turning off of the current steering switch are related to a steady state or a transient state output by the monostable trigger. For example, when the monostable trigger is a constant 1 integral double-edged monostable trigger, initially, the output of the constant 1 integral double-edged monostable trigger is 1, and the current steering switch is turned off; when the switching signal of an RF switch channel selection signal is detected, the output of the constant 1 integral double-edged monostable trigger is 0, the current steering switch is turned on, and the clock frequency is increased. After maintaining for a period of time, the constant 1 integral double-edged monostable trigger automatically switches the output to 1, and at this time, the clock frequency is reduced to the initial state.

The above-mentioned embodiments are only used to illustrate the technical scheme of the application, but not to limit it. Although the application has been described in detail with reference to the foregoing embodiments, it should be understood by those skilled in the art that it is still possible to modify the technical solutions described in the foregoing embodiments, or to equivalently replace some technical features thereof; these modifications or substitutions do not make the essence of the corresponding technical solutions deviate from the spirit and scope of the technical solutions of various embodiments of the present application.

What is claimed is:

1. A low-power consumption negative voltage generator for radio frequency (RF) switch, comprising:
   a monostable trigger, a voltage controlled oscillator, a non-overlapping clock circuit and a charge pump; wherein
   the monostable trigger receives a switch channel selection signal and changes from a steady state to a transient state when the switch channel selection signal jumps;
   the voltage controlled oscillator receives the steady state or the transient state output by the monostable trigger, increases a clock frequency when the steady state of the monostable trigger changes to the transient state, and restores the clock frequency to an initial state after the transient state of the monostable trigger recovers to the steady state;
   the non-overlapping clock circuit receives a latest clock frequency output by the voltage controlled oscillator, and uses the latest clock frequency to control a negative voltage bias output by the charge pump;
   the monostable trigger is one of a constant 1 integral double-edge monostable trigger, a constant 0 integral monostable trigger and a differential monostable trigger;
   when the monostable trigger is the constant 1 integral double-edge monostable trigger, the constant 1 integral double-edge monostable trigger comprises an integral RC circuit (Resistor-Capacitance circuit) and an exclusive NOR gate;
   the voltage controlled oscillator is a single-ended voltage controlled oscillator; the single-ended voltage controlled oscillator comprises a current steering switch and a ring oscillator;
   when the current steering switch is turned on, a current supplied to the ring oscillator increases;
   when the current steering switch is turned off, a current supplied to the ring oscillator decreases;

the turning on and turning off of the current steering switch is related to the steady state or the transient state output by the monostable trigger; and when the monostable trigger is the constant 1 integral double-edged monostable trigger, the output of the constant 1 double-edged monostable trigger is 1, and the current steering switch is turned off; when the output of the constant 1 double-edged monostable trigger is 0, the current steering switch is turned on.

2. The low-power consumption negative voltage generator for RF switch according to claim 1, wherein when a state of the monostable trigger is the transient state, a maintaining time of the transient state is determined according to an output stabilization time of the charge pump.

* * * * *